US 10,950,417 B2

(12) United States Patent
Tsuda et al.

(10) Patent No.: US 10,950,417 B2
(45) Date of Patent: Mar. 16, 2021

(54) SUBSTRATE PROCESSING APPARATUS AND SUBSTRATE LOADING MECHANISM

(71) Applicant: TOKYO ELECTRON LIMITED, Tokyo (JP)

(72) Inventors: Einosuke Tsuda, Nirasaki (JP); Seishi Murakami, Nirasaki (JP); Takayuki Kamaishi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 153 days.

(21) Appl. No.: 16/004,956

(22) Filed: Jun. 11, 2018

(65) Prior Publication Data

US 2018/0366303 A1    Dec. 20, 2018

(30) Foreign Application Priority Data

Jun. 16, 2017    (JP) .............................. JP2017-118977

(51) Int. Cl.
*H01J 37/32*    (2006.01)
*H01J 37/20*    (2006.01)
(Continued)

(52) U.S. Cl.
CPC ........ *H01J 37/32522* (2013.01); *H01J 37/20* (2013.01); *H01J 37/32724* (2013.01);
(Continued)

(58) Field of Classification Search
USPC ........................ 118/715, 724, 725, 666, 667; 156/345.27, 345.35, 345.37, 345.52,
(Continued)

(56) References Cited

U.S. PATENT DOCUMENTS

| 2003/0209324 A1* | 11/2003 | Fink ...................... H01J 37/321 |
| | | 156/345.48 |
| 2004/0068997 A1* | 4/2004 | Hirooka ............ H01J 37/32724 |
| | | 62/175 |

(Continued)

FOREIGN PATENT DOCUMENTS

| JP | H1-268030 A | 10/1989 |
| JP | H04-044353 A | 2/1992 |

(Continued)

*Primary Examiner* — Yewebdar T Tadesse
(74) *Attorney, Agent, or Firm* — Nath, Goldberg & Meyer; Jerald L. Meyer

(57) ABSTRACT

A substrate processing apparatus includes a process container; a process gas supply mechanism; a substrate loading table; a temperature adjusting medium passage; a temperature adjusting medium extraction mechanism; a heater; and a temperature controller. The temperature controller is configured to adjust a temperature of a target substrate to a first temperature by allowing a temperature adjusting medium to flow through the temperature adjusting medium passage of the substrate loading table; and adjust the temperature of the target substrate to a second temperature higher than the first temperature by extracting the temperature adjusting medium of the temperature adjusting medium passage using the temperature adjusting medium extraction mechanism while heating the target substrate using the heater.

9 Claims, 10 Drawing Sheets

(51) Int. Cl.
*H01L 21/02* (2006.01)
*H01L 21/311* (2006.01)

(52) U.S. Cl.
CPC .. *H01L 21/02057* (2013.01); *H01L 21/02063* (2013.01); *H01L 21/31116* (2013.01); *H01J 2237/334* (2013.01)

(58) Field of Classification Search
USPC .................................................. 156/345.53
See application file for complete search history.

(56) References Cited

U.S. PATENT DOCUMENTS

| | | | | |
|---|---|---|---|---|
| 2004/0175944 | A1* | 9/2004 | Kobayashi | H01L 21/02063 438/689 |
| 2009/0142513 | A1* | 6/2009 | Murakami | C23C 16/08 427/576 |
| 2014/0042716 | A1* | 2/2014 | Miura | H01L 21/67103 279/128 |
| 2015/0235860 | A1* | 8/2015 | Tomura | H01L 21/31116 438/694 |
| 2017/0350631 | A1* | 12/2017 | Yokoo | F25B 41/062 |

FOREIGN PATENT DOCUMENTS

| | | |
|---|---|---|
| JP | 7-183276 A | 7/1995 |
| JP | 2000-49143 A | 2/2000 |
| JP | 2004-504717 A | 2/2004 |
| JP | 2005-39185 A | 2/2005 |
| JP | 2006-310832 A | 11/2006 |
| JP | 2008-160000 A | 7/2008 |
| JP | 2008-192643 A | 8/2008 |
| JP | 2011-77452 A | 4/2011 |
| JP | 2012-256942 A | 12/2012 |
| JP | 2013-009001 A | 1/2013 |
| JP | 2015-154047 A | 8/2015 |
| JP | 2016-115933 A | 6/2016 |
| JP | 2017-59771 A | 3/2017 |
| KR | 10-0136788 B1 | 11/1989 |

* cited by examiner

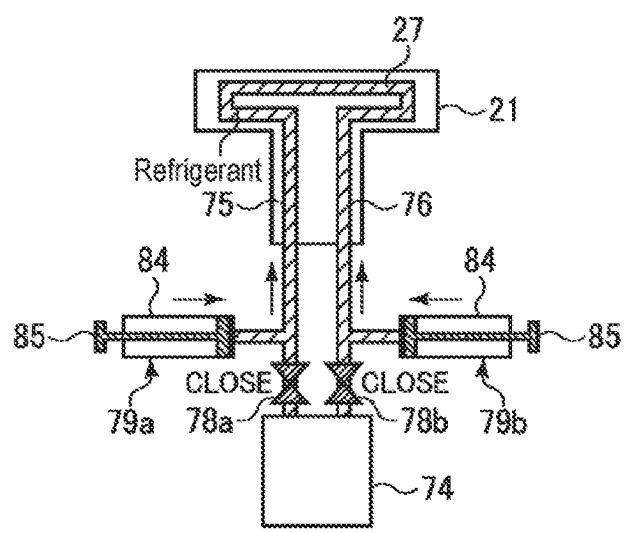

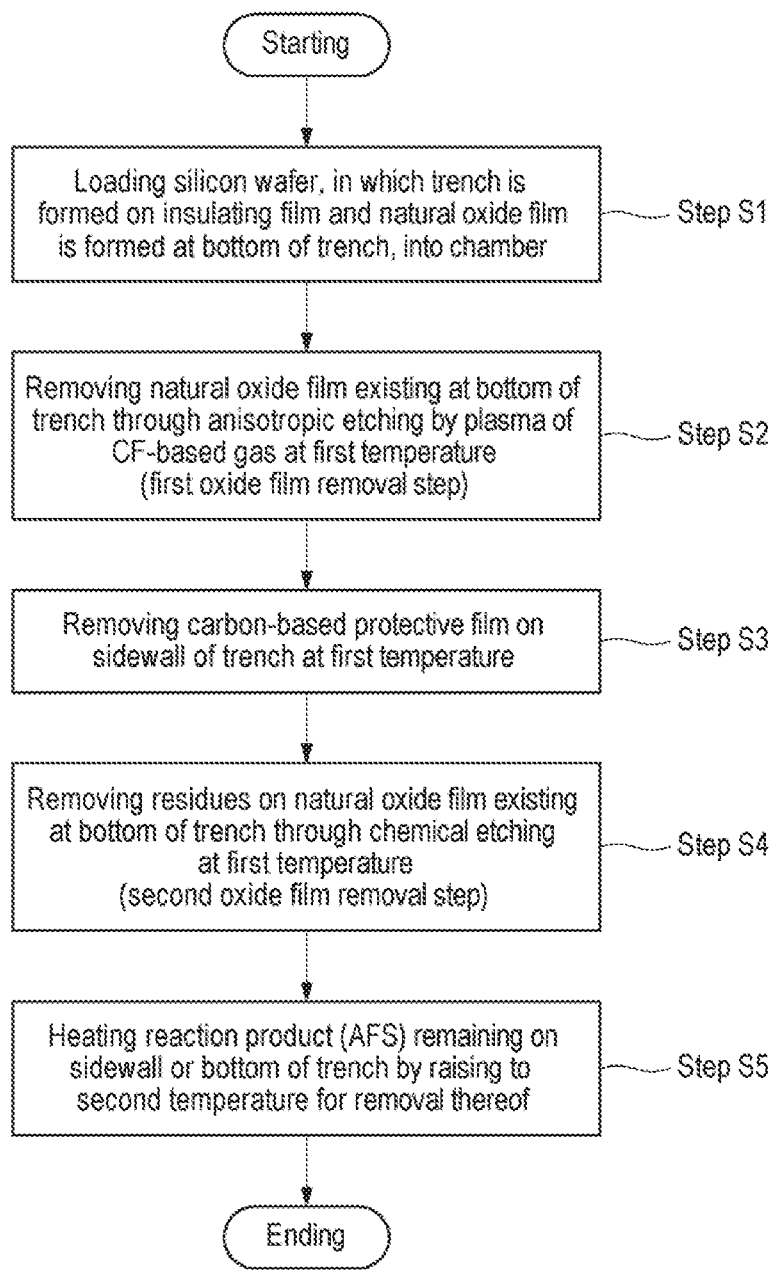

SUBSTRATE PROCESSING APPARATUS AND SUBSTRATE LOADING MECHANISM

CROSS-REFERENCE TO RELATED APPLICATION

This application is based upon and claims the benefit of priority from Japanese Patent Application No. 2017-118977, filed on Jun. 16, 2017, the entire contents of which are incorporated herein by reference.

TECHNICAL FIELD

The present disclosure relates to a substrate processing apparatus and a substrate loading mechanism.

BACKGROUND

For example, a chemical oxide removal (COR) process has been studied as a process capable of removing a natural oxide film of silicon existing in complicated structural portions such as source and drain portions of a FinFET. The COR process is a technique of etching a silicon oxide film by a process of adsorbing a hydrogen fluoride (HF) gas and an ammonia ($NH_3$) gas onto the silicon oxide film ($SiO_2$ film) at a temperature of, for example, about 30 degrees C., and reacting these gases with the silicon oxide film to generate ammonium fluorosilicate (($NH_4)_2SiF_6$; AFS), and a process of subliming the AFS by heating it at a temperature of, for example, about 90 degrees C.

Conventionally, when attempting to perform these processes at different temperatures within a single chamber (process container), it takes time to change the temperatures, and so it is common to perform these processes in separate chambers.

However, due to the complexity of a semiconductor manufacturing process, it is desired to perform a plurality of processes in a single chamber. Thus, there is a demand for an apparatus capable of performing such processes at different temperatures in a single chamber with high throughput.

Apparatuses that can raise and lower a substrate temperature at high speed have been used, but they are not intended to continuously perform a series of processes at different temperatures in a single chamber, making it difficult to apply to such applications.

SUMMARY

Some embodiments of the present disclosure provide a technique capable of continuously performing a plurality of processes at different temperatures on a target substrate in a single process container with high throughput.

According to one embodiment of the present disclosure, there is provided a substrate processing apparatus The substrate processing apparatus includes: a process container configured to maintain an interior of the process container in a vacuum state; a process gas supply mechanism configured to supply a process gas into the process container; a substrate loading table including a loading surface on which a target substrate is loaded in the process container; a temperature adjusting medium passage which is installed in the substrate loading table and through which a temperature adjusting medium for adjusting a temperature of the target substrate loaded on the substrate loading table flows; a temperature adjusting medium extraction mechanism configured to extract the temperature adjusting medium from the temperature adjusting medium passage; a heater installed at a position closer to the loading surface than the temperature adjusting medium passage of the substrate loading table; and a temperature controller configured to: adjust the temperature of the target substrate to a first temperature by allowing the temperature adjusting medium to flow through the temperature adjusting medium passage of the substrate loading table; and adjust the temperature of the target substrate to a second temperature higher than the first temperature by extracting the temperature adjusting medium of the temperature adjusting medium passage using the temperature adjusting medium extraction mechanism while heating the target substrate using the heater, wherein a process at the first temperature and a process at the second temperature are continuously performed on the target substrate.

According to another embodiment of the present disclosure, there is provided a substrate processing apparatus for removing a silicon oxide film on a target substrate having an insulating film on which a predetermined pattern is formed and the silicon oxide film is formed in a silicon portion in a bottom portion of the pattern. The substrate processing apparatus includes: a process container configured to maintain an interior of the process container in a vacuum state; a process gas supply mechanism configured to supply a process gas into the process container; a substrate loading table including a loading surface on which the target substrate is loaded in the process container; a temperature adjusting medium passage which is installed in the substrate loading table and through which a temperature adjusting medium for adjusting a temperature of the target substrate loaded on the substrate loading table flows; a temperature adjusting medium extraction mechanism configured to extract the temperature adjusting medium from the temperature adjusting medium passage; a heater installed at a position closer to the loading surface than the temperature adjusting medium passage of the substrate loading table; a plasma generating mechanism configured to generate plasma in the process container; a temperature controller configured to: adjust the temperature of the target substrate to a first temperature by allowing the temperature adjusting medium to flow through the temperature adjusting medium passage of the substrate loading table; and adjust the temperature of the target substrate to a second temperature higher than the first temperature by extracting the temperature adjusting medium of the temperature adjusting medium passage using the temperature adjusting medium extraction mechanism while heating the target substrate using the heater; and a controller configured to control a process in the substrate processing apparatus, wherein the controller is configured to control the process in the substrate processing apparatus to execute: a first process in which a silicon-containing oxide film formed in the bottom portion of the pattern is removed through ionic anisotropic plasma etching using plasma generated by the plasma generating mechanism along with a supply of a carbon-based gas from the process gas supply mechanism to the process container; a second process of removing residues on the silicon-containing oxide film after the anisotropic plasma etching of the target substrate through a chemical etching by a chemical gas supplied from the process gas supply mechanism; and a third process of removing a reaction product generated after the chemical etching, and wherein the temperature controller is configured to adjust the temperature of the target substrate to the first temperature during the first process and the second process, and to adjust the temperature of the target substrate to the second temperature during the third process.

According to still another embodiment of the present disclosure, there is provided a substrate loading mechanism for loading a target substrate and adjusting a temperature of the target substrate in a process container in which the target substrate is processed. The substrate loading mechanism includes: a substrate loading table including a loading surface on which the target substrate is loaded in the process container; a temperature adjusting medium passage which is installed in the substrate loading table and through which a temperature adjusting medium for adjusting the temperature of the target substrate loaded on the substrate loading table flows; a temperature adjusting medium extraction mechanism configured to extract the temperature adjusting medium from the temperature adjusting medium passage; a heater installed at a position closer to the loading surface than the temperature adjusting medium passage of the substrate loading table; and a temperature controller configured to: adjust the temperature of the target substrate to a first temperature by allowing the temperature adjusting medium to flow through the temperature adjusting medium passage of the substrate loading table; and adjust the temperature of the target substrate to a second temperature higher than the first temperature by extracting the temperature adjusting medium of the temperature adjusting medium passage using the temperature adjusting medium extraction mechanism while heating the target substrate using the heater.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A to 4C are diagrams illustrating a state of a refrigerant during a process at a first temperature and a process at a second temperature.

FIG. 5 is a flowchart illustrating an example of a specific processing method performed by the substrate processing apparatus according to one embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Substrate Processing Apparatus>

First, a configuration of a substrate processing apparatus according to one embodiment of the present disclosure will be described.

Figure 1:
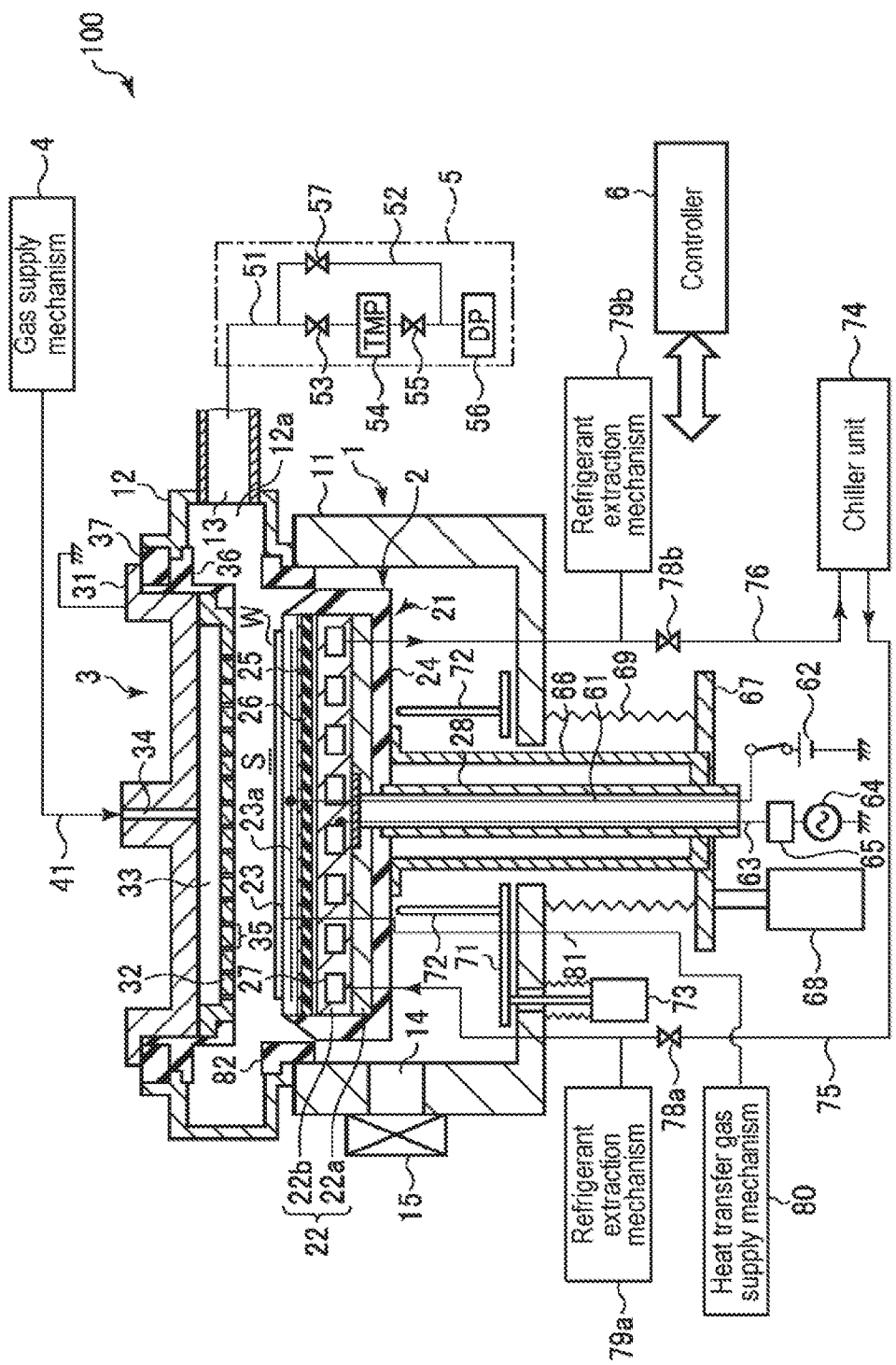
FIG. 1 is a cross-sectional view illustrating a substrate processing apparatus according to one embodiment of the present disclosure.
Figure 2:
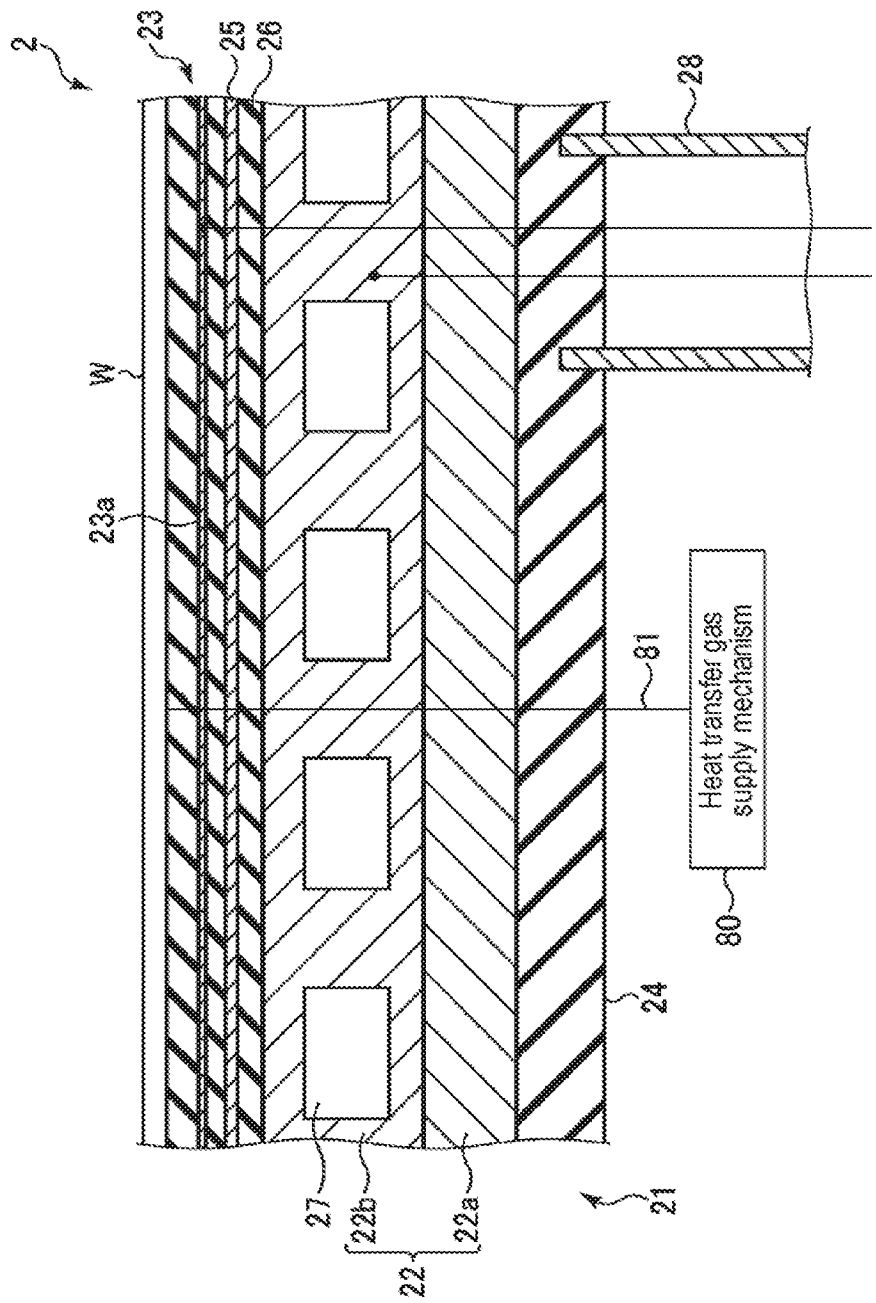
FIG. 2 is an enlarged cross-sectional view of a substrate loading mechanism of the substrate processing apparatus shown in FIG. 1.

FIG. 1 is a cross-sectional view illustrating a substrate processing apparatus according to one embodiment of the present disclosure, and FIG. 2 is an enlarged cross-sectional view of a substrate loading mechanism of the substrate processing apparatus of FIG. 1.

A substrate processing apparatus 100 includes a chamber 1 which is a process container, a substrate loading mechanism 2 having a loading surface for loading a target substrate W disposed in the chamber 1, a shower head 3 installed so as to face the loading surface of the substrate loading mechanism 2 and configured to introduce a process gas into the chamber 1, a process gas supply mechanism 4 for supplying a process gas to the shower head 3, an exhaust mechanism 5 for exhausting an interior of the chamber 1, and a controller 6 for controlling each component of the substrate processing apparatus 100.

The chamber 1 has a main body portion 11 forming a lower portion, and a processing space forming part 12 installed on the main body portion 11 and configured to form a processing space S. For example, the chamber 1 is made of aluminum which is not subjected to a surface treatment, or aluminum where an inner wall surface is anodized by out gas free (OGF).

A substrate loading/unloading port 14 is installed on a sidewall of the main body portion 11 of the chamber 1 such that the substrate loading/unloading port 14 can be opened and closed by a gate valve 15. The target substrate can be loaded and unloaded by a transfer mechanism (not shown) installed in an adjacent vacuum transfer chamber (not shown) while opening the gate valve 15.

An outer periphery of the processing space S in the processing space forming part 12 of the chamber 1 is formed as a ring-shaped exhaust space 12a, and the exhaust mechanism 5 is connected to the exhaust space 12a.

The substrate loading mechanism 2 includes a substrate loading table 21 having a loading surface on which the target substrate W is loaded, and a cylindrical tubular member 28 that supports the center of the substrate loading table 21 and vertically extends below the chamber 1. The substrate loading table 21 includes a main body 22 having a lower plate 22a and an upper plate 22b, an electrostatic chuck 23 installed on the main body 22, a heater 25 formed on a rear surface of the electrostatic chuck 23, and a cushion member 26 installed between the electrostatic chuck 23 and the main body 22 (the upper plate 22b). In addition, an insulating member 24 is installed so as to cover a bottom of the main body 22, and side surfaces of the main body 22, the electrostatic chuck 23, and the cushion member 26.

The main body 22 is made of metal such as aluminum, copper or the like, and a refrigerant passage 27 through which a refrigerant such as Galden (registered trademark) or the like flows is formed in the upper plate 22b.

The electrostatic chuck 23 is for electrostatically adsorbing the target substrate W, and its surface becomes the loading surface of the target substrate. The electrostatic chuck 23 is made of a dielectric, for example, ceramic such as $Al_2O_3$ or the like, and an electrode 23a for electrostatic adsorption is embedded in the electrostatic chuck 23. A DC power source 62 is connected to the electrode 23a via a power supply line 61 extending inside the tubular member 28. When a DC voltage is applied from the DC power source 62 to the electrode 23a, the target substrate W is electrostatically adsorbed. The thickness of the electrostatic chuck 23 is about 3 to 3.5 mm, which is thinner than the general thickness of 4.3 mm, to have small heat capacity.

The heater 25 is formed by printing on the rear surface of the electrostatic chuck 23. The heater 25 is made of, for example, tungsten, molybdenum, or a compound of one of these metals with alumina, titanium or the like, and is supplied with electric power from a heater power source (not shown) so as to generate heat.

The cushion member 26 has a function of absorbing a difference in thermal expansion between the electrostatic chuck 23 and the main body 22 (the upper plate 22b) and transferring cold heat of a refrigerant flowing through the refrigerant passage 27 to the electrostatic chuck 23. A material having high cushioning property and good thermal conductivity, for example, silicon resin, is used for the cushion member 26.

The substrate loading mechanism 2 has a chiller unit 74 that circulates a refrigerant in the refrigerant passage 27 in the upper plate 22b of the substrate loading table 21. A refrigerant supply pipe 75 for supplying a refrigerant to the refrigerant passage 27 and a refrigerant discharge pipe 76 for discharging the refrigerant from the refrigerant passage 27 to the chiller unit 74 are connected to the chiller unit 74. The refrigerant passage 27, the refrigerant supply pipe 75 and the refrigerant discharge pipe 76 are actually installed in the tubular member 28, but in FIG. 1, they are depicted outside the tubular member 28 for the sake of convenience.

Figure 3:
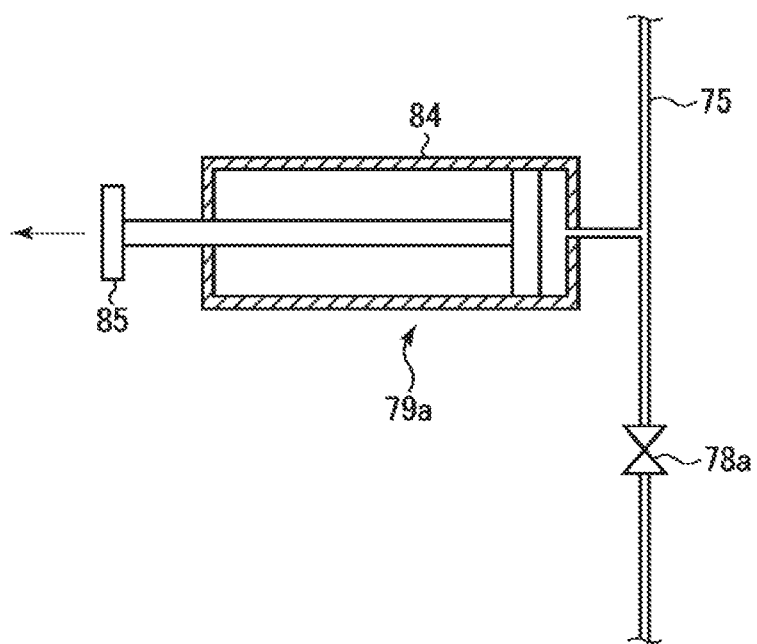
FIG. 3 is a cross-sectional view illustrating a configuration of a refrigerant extraction mechanism.

Opening/closing valves 78a and 78b are respectively installed in the refrigerant supply pipe 75 and the refrigerant discharge pipe 76. Refrigerant extraction mechanisms 79a and 79b are respectively installed in portions of the refrigerant supply pipe 75 and the refrigerant discharge pipe 76 above the opening/closing valves 78a and 78b such that the refrigerant in the refrigerant passage 27, the refrigerant supply pipe 75 and the refrigerant discharge pipe 76 above the opening/closing valves 78a and 78b is extracted while closing the opening/closing valves 78a and 78b. For example, as illustrated in FIG. 3, the refrigerant extraction mechanism 79a has a syringe shape having a cylinder 84 and a piston 85 inserted into the cylinder 84, and pulls the piston 85 by a proper actuator (not shown) to extract the refrigerant in the refrigerant passage 27 and the refrigerant supply pipe 75. The refrigerant extraction mechanism 79b is similarly configured to pull the piston 85 such that the refrigerant in the refrigerant passage 27 and the refrigerant discharge pipe 76 is extracted.

A heat transfer gas such as an He gas or the like is supplied from a heat transfer gas supply mechanism 80 to between the electrostatic chuck 23 and the target substrate W via a heat transfer gas supply pipe 81, and the temperature control of the target substrate W by the substrate loading table 21 is performed using the heat transfer gas.

The temperature control of the target substrate W is performed by the controller 6 to be described below. That is, the controller 6 has a function as a temperature controller of the target substrate W, and is configured to perform the temperature control to carry out a continuous process on the target substrate W at a first temperature (for example, 30 degrees C.) and at a second temperature (for example, 90 degrees C.) higher than the first temperature. During the process at the first temperature, the heater 25 is turned off and the temperature of the target substrate W is adjusted at the first temperature by circulating the refrigerant from the chiller unit 74 to the refrigerant passage 27. During the process at the second temperature, the refrigerant in the refrigerant passage 27 is extracted by the refrigerant extraction mechanisms 79a and 79b and the target substrate W is rapidly heated to the second temperature by the heater 25.

When such rapid temperature change occurs, since the main body 22 made of metal and the electrostatic chuck 23 which is dielectric have different thermal expansion coefficients, a large difference in thermal expansion occurs but this difference in thermal expansion is absorbed by the cushion member 26. The temperature of the target substrate W (the surface of the electrostatic chuck 23) is monitored by a thermocouple (not shown), and the temperature control is performed based on the monitored information. The temperature difference between the first temperature and the second temperature is preferably within a range of 20 to 100 degrees C.

A cylindrical outer tubular member 66 is installed outside the tubular member 28. An upper end of the outer tubular member 66 is fixed to the bottom surface of the substrate loading table 21 and a lower end surface of the outer tubular member 66 is fixed to the lower end portion of the tubular member 28. The lower end of the outer tubular member 66 is supported by a support plate 67. The support plate 67 is configured to move up and down along a guide member (not shown) by an elevating mechanism 68, and the substrate loading table 21 is configured to move up and down in the main body portion 11 of the chamber 1 between a processing position illustrated in FIG. 1 and a transfer position below the processing position via the support plate 67 and the outer tubular member 66. A bellows 69, which separates the internal atmosphere of the chamber 1 from an ambient air and expands and contracts according to an elevation operation of the substrate loading table 21, is installed between the support plate 67 and the bottom wall of the chamber 1.

An elevating plate 71 is installed near the bottom surface of the chamber 1, and three substrate elevating pins 72 (only two are shown) are installed on the elevating plate 71 so as to protrude upward. The substrate elevating pins 72 are configured to be raised and lowered through the elevating plate 71 by an elevating mechanism 73 installed below the chamber 1, and to be insertedly penetrated into through holes (not shown) formed on the substrate loading table 21 so as to be protrudable from the upper surface of the substrate loading table 21. Therefore, the target substrate W may be delivered between the transfer mechanism of the adjacent vacuum transfer chamber and the substrate loading table 21 via the substrate loading/unloading port 14.

In addition, a high frequency power source 64 for plasma generation is connected to the main body 22 (the upper plate 22b) of the substrate loading table 21 via a power supply line 63 extending inside the tubular member 28. A matching device 65 for impedance matching is connected to the upstream side of the high frequency power source 64 of the power supply line 63. The substrate loading table 21 serves as a lower electrode and the shower head 3 serves as an upper electrode to constitute a pair of parallel flat plate electrodes, and when a high frequency power is applied from the high frequency power source 64 to the substrate loading table 21, a capacitively coupled plasma is generated in the processing space S. Furthermore, when a high frequency power is applied from the high frequency power source 64 to the substrate loading table 21, ions in the plasma are drawn into the target substrate W. The frequency of the high frequency power output from the high frequency power source 64 is preferably set to 0.1 to 500 MHz, and for example, 13.56 MHz, is used.

A ring-shaped shield member 82 made of an insulator such as quartz or the like is installed between the main body portion 11 of the chamber 1 and the processing space forming part 12 so as to have a slight gap between the shield member 82 and the substrate loading table 21 which is located at the processing position. The shield member 82 has a function of shielding the plasma such that the plasma generated in the processing space S by the high frequency power from the high frequency power source 64 does not leak into the main body portion 11.

The shower head 3 has substantially the same diameter as that of the substrate loading table 21, and also has a main body portion 31 installed so as to close an upper opening of the chamber 1 and a shower plate 32 connected below the main body portion 31 to introduce a process gas into the chamber 1 in a shower shape. As the shower plate 32, it may be possible to use, for example, a shower plate obtained by forming a thermal spray coating made of yttria on the surface of a main body made of aluminum. A heater (not shown) is embedded in the shower plate 32 such that the shower plate 32 can be heated to a temperature within a range of, for example, 100 to 200 degrees C. A gas diffusion space 33 is formed between the main body portion 31 and the shower plate 32, and a gas introduction hole 34 formed at the center of the main body portion 31 is connected to the gas diffusion space 33. Gas discharge holes 35 are formed in the shower plate 32. Insulating members 36 and 37 are interposed between the shower head 3 and the processing space forming part 12 of the chamber 1. The chamber 1 and the shower head 3 may be electrically connected without installing any insulating member.

The process gas supply mechanism 4 has a plurality of gas supply sources for independently supplying a plurality of gases necessary for a plurality of processes to be continuously performed in the substrate processing apparatus 100, and a plurality of gas supply pipes for supplying respective gases from the plurality of gas supply sources (none of them are shown). An opening/closing valve and a flow rate controller such as a mass flow controller (none of them are shown) are installed in each of the gas supply pipes such that the aforementioned gases can be appropriately switched and the flow rate control of each gas can be performed. The gases from these gas supply pipes are supplied to the shower head 3 via a pipe 41.

An exhaust port 13 is installed in the exhaust space 12a of the processing space forming part 12 of the chamber 1 and a first exhaust pipe 51 of the exhaust mechanism 5 is connected to the exhaust port 13. A first end of a second exhaust pipe 52 is connected to the first exhaust pipe 51. A first pressure control valve 53, a turbo molecular pump 54, an opening/closing valve 55, and a dry pump 56 are sequentially connected to a downstream side of the connection portion of the first exhaust pipe 51. Meanwhile, a second pressure control valve 57 is installed in the second exhaust pipe 52. A second end of the second exhaust pipe 52 is connected to a portion between the opening/closing valve 55 of the first exhaust pipe 51 and the dry pump 56. Furthermore, during a process in which the interior of the chamber 1 is set at high pressure, the first pressure control valve 53 and the opening/closing valve 55 are closed and the exhaust is performed only by the dry pump 56. During a process in Which the interior of the chamber 1 is set at low pressure, the second pressure control valve 57 is closed and the first pressure control valve 53 and the opening/closing valve 55 are opened to perform the exhaust using both the dry pump 56 and the turbo molecular pump 54. The pressure control in the chamber 1 is performed by controlling the opening degree of the pressure control valves 53 and 57 based on a detection value of a pressure sensor (not shown) installed in the chamber 1.

The controller 6 is typically configured as a computer, and includes a main controller having a CPU for controlling respective components of the substrate processing apparatus 100, for example, a valve and a mass flow controller of the process gas supply mechanism 4, the high frequency power source 64, the exhaust mechanism 5, the chiller unit 74, the refrigerant extraction mechanisms 79a and 79b, the heat transfer gas supply mechanism 80, the heater power source, the transfer mechanism, the gate valve 15, the elevating mechanisms 68 and 73 and the like, an input device (a keyboard, a mouse, or the like), an output device (a printer or the like), a display device (a display or the like), and a storage device (a storage medium). In addition to the controller 6 having the function as the temperature controller as described above, the main controller has a function of controlling the substrate processing apparatus 100 to cause it to execute a predetermined processing operation based on, for example, a process recipe stored in a storage medium built in the storage device or a storage medium set in the storage device.

<Operation of Substrate Processing Apparatus>

Next, an operation of the substrate processing apparatus 100 configured as described above will be described.

In the substrate processing apparatus 100, a plasma process performed by generating plasma in the processing space S by means of supplying a high frequency power from the high frequency power source 64 to the substrate loading table 21, together with the supply of a predetermined process gas, a chemical process performed by supplying a predetermined chemical gas, and a heating process such as removal of a reaction product are continuously carried out on a single target substrate W in the chamber 1. For example, after the plasma process is performed, the chemical process is performed and then the heating process for removal of a reaction product is performed. Each process is performed by setting the interior of the chamber 1 to a pressure corresponding to each process by the exhaust mechanism 5.

Figure 4A:
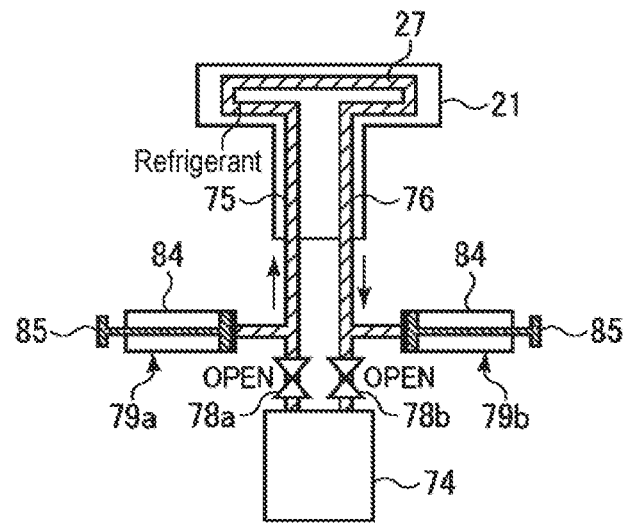

During the plasma process and the chemical process, a refrigerant is allowed to flow from the chiller unit 74 to the refrigerant passage 27 of the substrate loading table 21 such that the temperature of the target substrate W is adjusted to a first temperature, for example, about 30 degrees C., which is relatively low. Specifically, as illustrated in FIG. 4A, the opening/closing valves 78a and 78b are opened and the refrigerant in the chiller unit 74 is circulated through the refrigerant supply pipe 75, the refrigerant passage 27 and the refrigerant discharge pipe 76. In the chiller unit 74, the temperature adjustment of the refrigerant is performed and the refrigerant is circulated at a predetermined temperature such that the temperature of the target substrate W is adjusted to the first temperature (for example, 30 degrees C.).

Figure 4B:
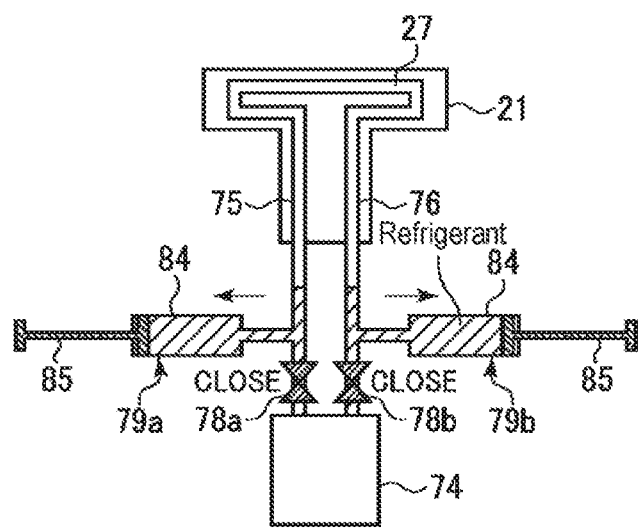

In this state, for example, when the heating process such as the reaction product removal process is performed on the target substrate W on the substrate loading table 21, the heating starts by the heater 25, and the refrigerant is extracted from the refrigerant passage 27 and the temperature of the target substrate W is adjusted to a second temperature (for example, 90 degrees C.) which is relatively high. Specifically, as illustrated in FIG. 4B, the opening/ closing valves 78a and 78b are closed to stop the flow of the refrigerant and the pistons 85 of the refrigerant extraction mechanisms 79a and 79b are pulled to extract the refrigerant in the refrigerant passage 27, the refrigerant supply pipe 75 and the refrigerant discharge pipe 76 into the cylinder 84. At this time, the temperature difference between the first temperature and the second temperature is preferably within a range of 20 to 100 degrees C.

As described above, when the heater 25 heats up to the second temperature, the refrigerant can be extracted from the refrigerant passage 27 without being deprived of the heat of the heater 25, and the heat of the heater 25 can efficiently contribute to the heating of the substrate W. In addition, since the heater 25 is printed on the rear surface of the electrostatic chuck 23, only the electrostatic chuck 23 exists between the heater 25 and the target substrate W, and also from this point, the heat of the heater can be efficiently supplied to the target substrate W. Therefore, extremely efficient heating can be performed on the target substrate W to reach the second temperature (for example, 90 degrees C.) which is relatively high in an extremely short time. Thus, in the case where the process at the first temperature, which is relatively low, performed by allowing the refrigerant to flow with the target substrate W loaded on the substrate loading table 21, and the process at the second temperature, which is relatively high, performed by heating by the heater are continuously performed, it is possible to realize the processes with high throughput.

Furthermore, since the thickness of the electrostatic chuck 23 itself is also set to 3 to 3.5 mm which is thinner than the general thickness of 4.3 mm, it is possible to reduce the heat capacity of the electrostatic chuck 23 by a maximum of about 30% and to further enhance the heating efficiency of the target substrate W.

In addition, since the cushion member 26 having high cushioning property and high thermal conductivity, such as silicon resin, is installed between the electrostatic chuck 23 of the substrate loading table 21 and the main body 22, it is possible to prevent the substrate loading table 21 from being damaged due to a difference in thermal expansion between the electrostatic chuck 23 made of ceramics and the main body 22 made of metal when rapidly heated by the heater 25. Moreover, by using resin having high thermal conductivity such as silicon resin as the cushion member 26, it is possible to efficiently supply cold heat of the refrigerant to the target substrate W during the temperature adjustment of the target substrate W by the refrigerant.

After this heating process is completed, the heating by the heater 25 is turned off, and as illustrated in FIG. 4C, the pistons 85 of the refrigerant extraction mechanisms 79a and 79b are pushed to return the refrigerant extracted into the cylinder 84 to the refrigerant passage 27 or the like for preparing a next process. By opening the opening/closing valves 78a and 78b in this state, the refrigerant can be circulated again and quickly returned to the first temperature.

As described above, according to the substrate processing apparatus 100 of the present embodiment, since the temperature of the target substrate W loaded on the substrate loading table 21 can be very quickly changed from the first temperature which is relatively low to the second temperature which is relatively high, it is possible to realize the increase of the temperature of the target substrate with high throughput, while keeping the target substrate loaded on the substrate loading table, which has not conventionally been done as a cause of lowering the throughput.

When it is difficult to allow the temperature of the target substrate W to reach the second temperature within the set time by the extraction of the refrigerant and the heating by the heater 25, the substrate loading table 21 may be raised by the elevating mechanism 68 or the target substrate W may be raised by lifting up the substrate elevating pins 72 such that the target substrate W is brought close to the shower plate 32 so as to supplementarily increase the temperature of the target substrate W by the heat of the shower plate 32.

<Example of Processing Method by Substrate Processing Apparatus>

Next, an example of a specific processing method performed by the substrate processing apparatus as described above will be described. FIG. 5 is a flowchart illustrating an example of the processing method, and FIGS. 6A to 6E are process cross-sectional views of the processing method.

In the present example, a case where an oxide film removal process is performed using the aforementioned substrate processing apparatus as an oxide film removing apparatus for removing a natural oxide film formed on a surface of a silicon portion before forming a contact by forming a contact metal on the silicon portion at the bottom of a trench in a target substrate on which the trench is formed as a predetermined pattern will be described.

Figure 6A:
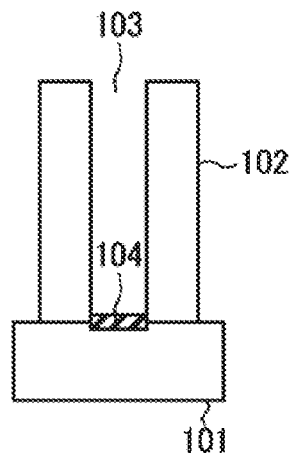
FIGS. 6A to 6E are process cross-sectional views illustrating an example of a specific processing method performed by the substrate processing apparatus according to one embodiment of the present disclosure.

First, as illustrated in FIG. 6A, a target substrate (silicon wafer) W in which an insulating film 102 is formed on a silicon substrate 101 and a trench 103 is formed as a predetermined pattern in/on the insulating film 102 is carried into the chamber 1 of the substrate processing apparatus 100 and loaded on the substrate loading table 21 (step S1). A natural oxide film (silicon-containing oxide 104 is formed on a silicon portion at the bottom of the trench 103. The insulating film 102 is mainly formed as an $SiO_2$ film. A portion of the insulating film 102 may be an SiN film.

Figure 7:
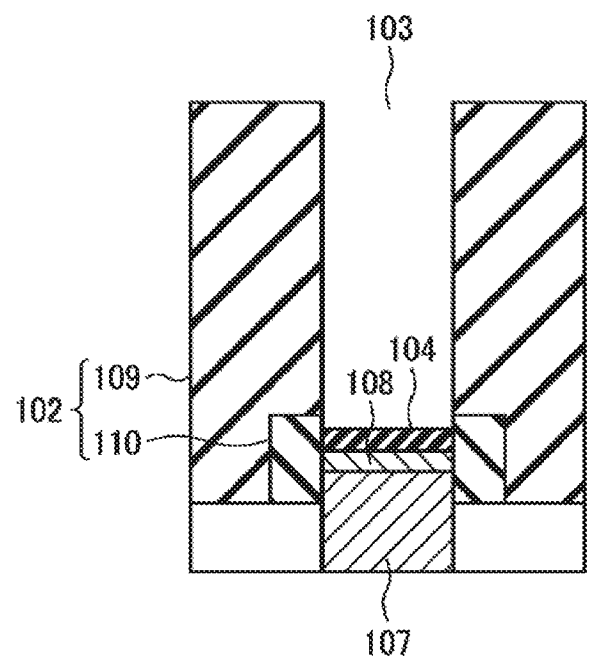
FIG. 7 is a cross-sectional view taken along a direction orthogonal to a trench, illustrating a structure for forming a FinFET to which the specific processing method is applied.
Figure 8:
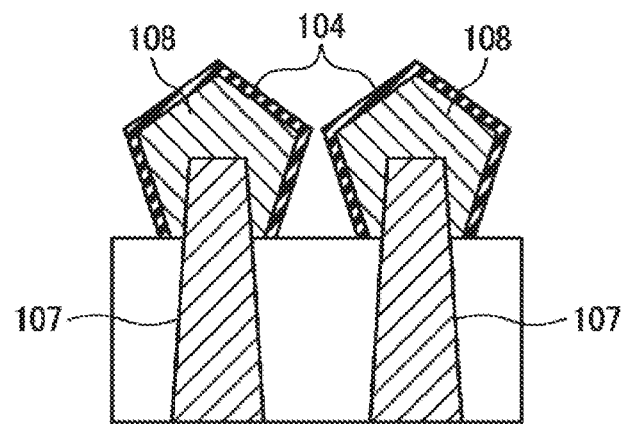
FIG. 8 is a cross-sectional view taken along a direction of a trench, illustrating a structure for forming a FinFET to which the specific processing method is applied.

An example of this target substrate (silicon wafer) W may include one for forming a FinFET. FIGS. 7 and 8 are cross-sectional views illustrating an example of a target substrate for forming a FinFET. Furthermore, FIG. 7 is a cross-sectional view taken along a direction orthogonal to the trench 103, and FIG. 8 is a cross-sectional view taken along a direction of the trench 103. In this example, polygonal epitaxial growth portions 108 made of Si or SiGe formed at leading ends of Si fins 107 are provided at the bottom of the trench 103 as the silicon portions, and the epitaxial growth portion 108 constitutes a source and a drain. In addition, natural oxide films 104 are formed on the surfaces of the epitaxial growth portions 108. In this example, the insulating film 102 is configured by an $SiO_2$ film 109 which is a main part and an SiN film 110 which constitutes a bottom portion. In FIG. 8, the epitaxial growth portion 108 is shown as a pentagon but may be a rectangle.

The trench of the FinFET has, for example, a Top CD of 8 to 10 nm, a depth of 100 to 120 nm, and an aspect ratio of 12 to 15.

Furthermore, prior to the oxide film removal process, the target substrate (silicon wafer) may be cleaned.

Figure 6B:
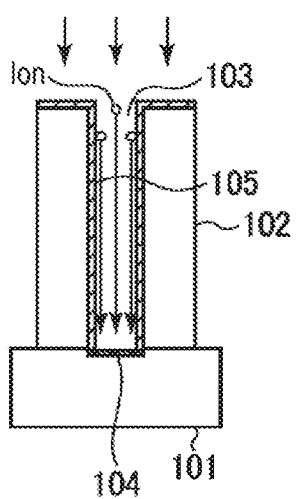

Subsequently, in a state in which the target substrate W is set at the first temperature (for example, 30 degrees C.) by allowing the refrigerant to flow through the refrigerant passage 27, the natural oxide film 104 at the bottom of the trench is removed through ionic anisotropic etching by plasma of a gas containing carbon (first oxide film removing step) (step S2; FIG. 6B).

This process is anisotropic etching utilizing the straightness of ions, and is performed by generating plasma in the processing space S by means of applying a high frequency power from the high frequency power source 64 to the substrate loading table 21 while supplying a gas containing carbon from the process gas supply mechanism 4 to the processing space S in the chamber 1 through the shower head 3. As the gas containing carbon, it may be possible to appropriately use a fluorocarbon-based $C_xF_y$-based) gas such as $CF_4$, $C_4F_8$ or the like. As the gas containing carbon, it may also possible to use a fluorinated hydrocarbon ($C_xH_yF_z$-based) gas such as a $CH_2F_2$ or the like. In addition to these gases, it may contain a rare gas such as an Ar gas, an inert gas such as an $N_2$ gas, and even a trace amount of $O_2$ gas.

By using these gases, since a carbon-based protective fit 105 is formed on a sidewall of the trench 103 during the anisotropic etching, it is possible to etch the natural oxide film while suppressing the etching progress of the sidewall. By this process, it is possible to remove most of the natural oxide film 104 at the bottom of the trench while suppressing CD loss.

In order to secure the straightness of the ions, this process is preferably performed by setting the internal pressure of the chamber 1 as low as possible, and is performed at about 0.1 Torr (13.3 Pa) or lower by using the turbo molecular pump 54 and the dry pump 56 in the exhaust mechanism 5. Since it is also the plasma process, a low temperature may be used. Although the strict temperature control is unnecessary, as described above, the temperature is set at the first temperature required for chemical etching in step S4 to be described below by allowing the refrigerant to flow through the refrigerant passage 27.

Figure 6C:
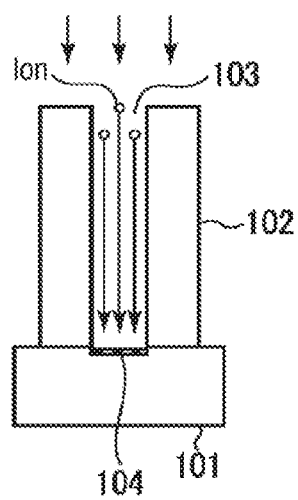

Subsequently, in a state in which the refrigerant is allowed to flow through the refrigerant passage 27, the target substrate W is maintained at the first temperature (for example, 30 degrees C.) and the process of removing the carbon-based protective film by plasma such as, for example, $NF_3+NH_3$ plasma is performed (step S3; FIG. 6C).

This process is performed by generating plasma in the processing space S by means of applying a high frequency power from the high frequency power source 64 to the substrate loading table 21 while supplying, for example, an $NF_3$ gas, an $NH_3$ gas or the like, from the process gas supply mechanism 4 to the processing space S in the chamber 1 via the shower head 3.

Since this process is also a removal process by plasma, it is desirable that the process pressure be low to some extent. However, since it is necessary to remove residues on the sidewall, it is desirable that the straightness of ions be weaker than that in step S2. Therefore, the process pressure in step S3 is higher than that in step S2, preferably about 0.5 Torr (66.7 Pa) or less. Also, as in step S2, since it is the plasma process, a low temperature may be used. Although the strict temperature control is unnecessary, as described above, it is set at the first temperature (for example, 30 degrees C.) required for chemical etching in step S4 to be described below by allowing the refrigerant to flow through the refrigerant passage 27. The process of removing a carbon-based protective film in step S3 may also be performed by, for example, plasma generated from an $H_2$ gas.

Most of the natural oxide film 104 is removed by the first oxide film removal step in step S2, but the natural oxide films on the surfaces of the epitaxial growth portions 108 having a complicated shape at the bottom of the trench of the FinFET illustrated in FIG. 8 cannot be removed only by anisotropy etching.

Figure 6D:
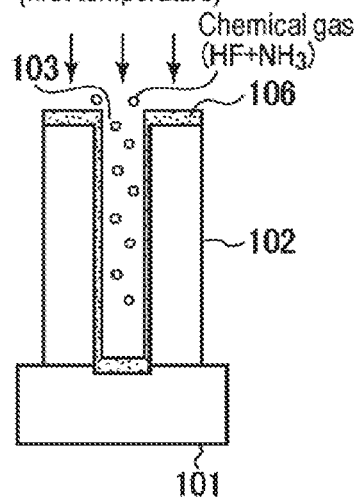

Therefore, after the carbon-based protective film removal process in step S3, in a state in which the refrigerant is allowed to flow through the refrigerant passage 27, the target substrate W is maintained at the first temperature (for example, 30 degrees C.), and residues on the natural oxide film 104 existing at the bottom of the trench 103 are removed by chemical etching (second oxide film removal step) (step S4; FIG. 6D).

Since the chemical etching is performed without plasma, is dry etching by a reaction gas, and is isotropic etching, the natural oxide films 104 on the surfaces of the epitaxial growth portions 108 having a complicated shape can be removed. In this example, the COR process using an $NH_3$ gas and an HF gas is used as the chemical etching.

During the COR process, an $NH_3$ gas and an HF gas are supplied from the process gas supply mechanism 4 to the processing space S in the chamber 1 through the shower head 3 in a state in which no high frequency power is applied. In addition to the $NH_3$ gas and the HF gas, an inert gas such as an Ar gas, an $N_2$ gas or the like may be added as a dilution gas.

Since the chemical etching such as the COR process is isotropic etching, there is a possibility that the sidewall of the trench is also etched to cause CD loss. However, in step S4, only the nature oxide film slightly remaining at the bottom of the trench is removed within a short processing time, and thus, the CD loss will hardly occur in practice.

When step S4 is performed, it is desirable that the process pressure be about 0.01 to 5 Torr (1.33 to 667 Pa). In this case, when the pressure is high pressure of 2 Torr or more, the exhaust mechanism 5 performs the exhaust only by the dry pump 56. Furthermore, although the first temperature is exemplified as 30 degrees C., the smoothness of the etching surface can be enhanced by performing the COR process at a low temperature as described above.

During the COR process, a reaction product 106 mainly made of ammonium fluorosilicate (($NH_4)_2SiF_6$; AFS) is formed on the upper surface of the insulating film 102 and at the bottom portion and the sidewall of the trench 103 by reaction with the $NH_3$ gas and the HF gas.

Figure 6E:
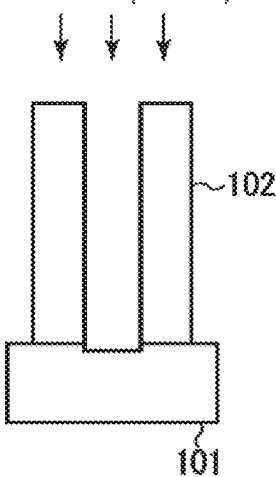

Therefore, the reaction product 106 remaining at the bottom of the trench 103 and the sidewall of the insulating film 102 is sublimated and removed by heating to the second temperature (for example, 90 degrees C.) by the heater 25 (step S5; FIG. 6E).

In this process, an inert gas such as an $N_2$ gas, an Ar gas or the like is introduced into the chamber 1 from the process gas supply mechanism 4, the internal pressure of the chamber is set to 1 to 5 Torr (133 to 667 Pa), the heating starts by the heater 25, the opening/closing valves 78a and 78b is closed to stop the refrigerant flowing through the refrigerant passage 27, and the piston 85 of the refrigerant extraction mechanisms 79a and 79b is pulled to extract the refrigerant in the refrigerant passage 27, the refrigerant supply pipe 75 and the refrigerant discharge pipe 76 into the cylinder 84.

Thus, the heat of the heater 25 can efficiently contribute to the heating of the target substrate W without being deprived by the refrigerant. In addition, since the heater 25 is printed on the rear surface of the electrostatic chuck 23, only the electrostatic chuck 23 exists between the heater 25 and the target substrate W. From this point, the heat of the heater 25 can be efficiently supplied to the target substrate W. Therefore, the target substrate W can be heated very efficiently such that it can reach the second temperature (for example, 90 degrees C.) in an extremely short time. Thus, the series of processes described above can be realized with high throughput. Furthermore, when it is difficult to reach the second temperature in a target time, as described above, the target substrate W is brought close to the shower plate 32 by raising the substrate loading table 21 or raising the target substrate W such that the temperature of the target substrate W can be supplementarily increased by the heat of the shower plate 32.

<Other Applications>

While one embodiment of the present disclosure has been described above, the present disclosure is not limited to the aforementioned embodiment but may be differently modified without departing from the spirit of the present disclosure.

For example, in the aforementioned embodiment, there has been described an example in which the substrate processing apparatus of the present disclosure is applied to a case where a natural oxide film removal process is performed in a contact portion at the bottom of a trench of a FinFET, as a specific example of a case where a plasma process and a chemical process are performed on a target substrate at a first temperature which is relatively low and a heating process is performed on a target substrate at a second temperature which is relatively high. However, the present disclosure is not limited thereto and may be applied to any case such as, a process is performed on a target substrate at a first temperature to have a temperature of the target substrate be relatively low by allowing a refrigerant to flow, and thereafter, a process is performed on the target substrate at a second temperature to have the temperature of the target substrate be relatively high by a heater. Furthermore, the first temperature and the second temperature are not limited to the temperatures exemplified in the aforementioned embodiment.

Moreover, in the aforementioned embodiment, there has been described an example in which the first temperature is realized by allowing the refrigerant to flow, but the first temperature may be higher than a room temperature, and in that case, it is sufficient to allow a temperature adjusting medium having a temperature higher than the room temperature to flow.

According to the present disclosure in some embodiments, the temperature of a target substrate is adjusted to a first temperature by allowing a temperature adjusting medium to flow through a temperature adjusting medium passage of a substrate mounting table, heating is performed by a heater installed on a loading surface side rather than the temperature adjusting medium passage, the temperature adjusting medium of the temperature adjusting medium passage is extracted by a temperature adjusting medium extraction mechanism, and the temperature of the target substrate is adjusted to a second temperature higher than the first temperature. Thus, it is possible to continuously perform a plurality of processes at different temperatures on a single target substrate in a single process container with high throughput.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process container configured to maintain an interior of the process container in a vacuum state;
   a process gas supply mechanism configured to supply a process gas into the process container;
   a substrate loading table including a loading surface on which a target substrate is loaded in the process container;
   a temperature adjusting medium passage which is installed in the substrate loading table and through which a temperature adjusting medium for adjusting a temperature of the target substrate loaded on the substrate loading table flows;
   a temperature adjusting medium supply unit configured to allow the temperature adjusting medium to flow through the temperature adjusting medium passage;
   a temperature adjusting medium extraction mechanism configured to extract the temperature adjusting medium from the temperature adjusting medium passage;
   a heater installed at a position closer to the loading surface than the temperature adjusting medium passage of the substrate loading table; and
   a temperature controller configured to:
      adjust the temperature of the target substrate to a first temperature by allowing the temperature adjusting medium to flow through the temperature adjusting medium passage of the substrate loading table; and
      adjust the temperature of the target substrate to a second temperature higher than the first temperature by extracting the temperature adjusting medium of the temperature adjusting medium passage using the temperature adjusting medium extraction mechanism while heating the target substrate using the heater,
   wherein a process at the first temperature and a process at the second temperature are continuously performed on the target substrate,
   wherein a temperature adjusting medium supply path configured to supply the temperature adjusting medium to the temperature adjusting medium passage and a temperature adjusting medium discharge path configured to discharge the temperature adjusting medium from the temperature adjusting medium passage are connected to the temperature adjusting medium supply unit, and an opening/closing valve is installed in each of the temperature adjusting medium supply path and the temperature adjusting medium discharge path, and
   wherein the temperature adjusting medium extraction mechanism has a syringe shape having a cylinder and a piston inserted into the cylinder, is connected to positions on a side of the temperature adjusting medium passage rather than the opening/closing valves of the temperature adjusting medium supply path and the temperature adjusting medium discharge path, and is configured to extract the temperature adjusting medium in the temperature adjusting medium passage by pulling the piston while closing the opening/closing valves.

2. The substrate processing apparatus of claim 1, wherein the substrate loading table includes:
   a main body made of metal and in which the temperature adjusting medium passage is formed;
   an electrostatic chuck installed on the main body, wherein the electrostatic chuck includes the loading surface, is configured to electrostatically adsorb the target substrate, and is configured such that electrodes are installed in a dielectric material; and
   a cushion member installed between the electrostatic chuck and the main body, wherein the heater is printed on a rear surface of the electrostatic chuck.

3. The substrate processing apparatus of claim 2, wherein a thickness of the electrostatic chuck is 3 to 3.5 mm.

4. The substrate processing apparatus of claim 1, wherein a temperature difference between the first temperature and the second temperature is 20 to 100 degrees C.

5. The substrate processing apparatus of claim 1, further comprising a shower head installed so as to face the substrate loading table and configured to introduce the process gas into the process container in a shower shape.

6. The substrate processing apparatus of claim 5, further comprising an elevating mechanism configured to move the substrate loading table up and down, and elevating pins configured to raise and lower the target substrate with respect to the loading surface, wherein the temperature controller is configured to bring the target substrate close to the shower head to assist the heating of the target substrate by raising the elevating mechanism or by lifting up the elevating pins when the temperature of the target substrate is adjusted to the second temperature while heating the shower head.

7. The substrate processing apparatus of claim 1, further comprising a plasma generating mechanism configured to generate plasma in the process container, wherein the process at the first temperature includes a process by plasma generated by the plasma generating mechanism.

8. The substrate processing apparatus of claim 1, wherein the process at the first temperature includes a chemical process performed by supplying a chemical gas, and the process at the second temperature includes a process of removing a reaction product generated by the chemical process.

9. A substrate processing apparatus for removing a silicon oxide film on a target substrate having an insulating film on which a predetermined pattern is formed and the silicon oxide film is formed in a silicon portion in a bottom portion of the pattern, the substrate processing apparatus comprising:

a process container configured to maintain an interior of the process container in a vacuum state;

a process gas supply mechanism configured to supply a process gas into the process container;

a substrate loading table including a loading surface on which the target substrate is loaded in the process container;

a temperature adjusting medium passage which is installed in the substrate loading table and through which a temperature adjusting medium for adjusting a temperature of the target substrate loaded on the substrate loading table flows;

a temperature adjusting medium supply unit configured to allow the temperature adjusting medium to flow through the temperature adjusting medium passage;

a temperature adjusting medium extraction mechanism configured to extract the temperature adjusting medium from the temperature adjusting medium passage;

a heater installed at a position closer to the loading surface than the temperature adjusting medium passage of the substrate loading table;

a plasma generating mechanism configured to generate plasma in the process container;

a temperature controller configured to:

adjust the temperature of the target substrate to a first temperature by allowing the temperature adjusting medium to flow through the temperature adjusting medium passage of the substrate loading table; and adjust the temperature of the target substrate to a second temperature higher than the first temperature by extracting the temperature adjusting medium of the temperature adjusting medium passage using the temperature adjusting medium extraction mechanism while heating the target substrate using the heater; and a controller configured to control a process in the substrate processing apparatus, wherein the controller is configured to control the process in the substrate processing apparatus to execute:

a first process in which a silicon-containing oxide film formed in the bottom portion of the pattern is removed through ionic anisotropic plasma etching using plasma generated by the plasma generating mechanism along with a supply of a carbon-based gas from the process gas supply mechanism to the process container;

a second process of removing residues on the silicon-containing oxide film after the ionic anisotropic plasma etching of the target substrate through a chemical etching by a chemical gas supplied from the process gas supply mechanism; and a third process of removing a reaction product generated after the chemical etching, and wherein the temperature controller is configured to adjust the temperature of the target substrate to the first temperature during the first process and the second process, and to adjust the temperature of the target substrate to the second temperature during the third process, wherein a temperature adjusting medium supply path configured to supply the temperature adjusting medium to the temperature adjusting medium passage and a temperature adjusting medium discharge path configured to discharge the temperature adjusting medium from the temperature adjusting medium passage are connected to the temperature adjusting medium supply unit, and an opening/closing valve is installed in each of the temperature adjusting medium supply path and the temperature adjusting medium discharge path, and wherein the temperature adjusting medium extraction mechanism has a syringe shape having a cylinder and a piston inserted into the cylinder, is connected to positions on a side of the temperature adjusting medium passage rather than the opening/closing valves of the temperature adjusting medium supply path and the temperature adjusting medium discharge path, and is configured to extract the temperature adjusting medium in the temperature adjusting medium passage by pulling the piston while closing the opening/closing valves.

* * * * *